(12) United States Patent
Ban et al.

(10) Patent No.: US 11,561,431 B2
(45) Date of Patent: Jan. 24, 2023

(54) BINDING BACKPLANE AND MANUFACTURING METHOD THEREOF, BACKLIGHT MODULE AND DISPLAY DEVICE

(71) Applicant: BOE TECHNOLOGY GROUP CO., LTD., Beijing (CN)

(72) Inventors: Shengguang Ban, Beijing (CN); Shuilang Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 399 days.

(21) Appl. No.: 16/957,350

(22) PCT Filed: Jul. 29, 2019

(86) PCT No.: PCT/CN2019/098189
§ 371 (c)(1),
(2) Date: Jun. 23, 2020

(87) PCT Pub. No.: WO2021/016808
PCT Pub. Date: Feb. 4, 2021

(65) Prior Publication Data
US 2022/0326568 A1 Oct. 13, 2022

(51) Int. Cl.
*G02F 1/13357* (2006.01)
*H01L 33/60* (2010.01)
(Continued)

(52) U.S. Cl.
CPC .. *G02F 1/133603* (2013.01); *G02F 1/133605* (2013.01); *G02F 1/133612* (2021.01);
(Continued)

(58) Field of Classification Search
CPC ......... G02F 1/133603; G02F 1/133605; G02F 1/133612; G09G 3/22; G09G 3/32;
(Continued)

(56) References Cited

U.S. PATENT DOCUMENTS

| | | | |
|---|---|---|---|
| 2008/0030645 A1 | 2/2008 | Nam et al. | |
| 2012/0229039 A1 | 9/2012 | Kang | |
| 2013/0176739 A1 | 7/2013 | Uehara | |
| 2014/0367633 A1* | 12/2014 | Bibl | ............... H01L 27/3246 257/13 |

(Continued)

FOREIGN PATENT DOCUMENTS

| | | |
|---|---|---|
| CN | 101118051 A | 2/2008 |
| CN | 103200764 A | 7/2013 |

(Continued)

OTHER PUBLICATIONS

Chinese Application No. 201980001183.X, The First Office Action dated Apr. 14, 2022.

*Primary Examiner* — Jessica M Merlin
(74) *Attorney, Agent, or Firm* — Dinsmore & Shohl LLP

(57) ABSTRACT

The present disclosure provides a binding backplane and a manufacturing method thereof, a backlight module and a display device. The binding backplane includes: a substrate; a first trace layer on the substrate; a planarizing layer on a side of the first trace layer away from the substrate; a second trace layer on the planarizing layer and including a connecting portion and a binding portion; a surface protective layer on the second trace layer away and exposing the binding portion; and a conductive reflection structure on a side of the surface protective layer close to the substrate, wherein the conductive reflection structure includes a grounding portion, a distance between a surface of the grounding portion away from the substrate and the substrate is not greater than a distance between a surface of the binding portion away from the substrate and the substrate.

20 Claims, 5 Drawing Sheets

(51) Int. Cl.
*G02F 1/1335* (2006.01)
*H01L 25/075* (2006.01)
*G09G 3/22* (2006.01)
*G09G 3/32* (2016.01)

(52) U.S. Cl.
CPC ............. *G09G 3/22* (2013.01); *G09G 3/32* (2013.01); *H01L 25/0753* (2013.01); *H01L 33/60* (2013.01); *G02F 2201/07* (2013.01); *G02F 2201/50* (2013.01); *G02F 2202/16* (2013.01); *G09G 2300/0426* (2013.01); *H05K 2201/10106* (2013.01)

(58) Field of Classification Search
CPC ........ G09G 2300/0426; H01L 25/0753; H01L 33/60; H05K 2201/10106
See application file for complete search history.

(56) References Cited

U.S. PATENT DOCUMENTS

| | | |
|---|---|---|
| 2016/0111401 A1 | 4/2016 | Lin et al. |
| 2018/0090058 A1* | 3/2018 | Chen ................... G09G 3/32 |
| 2018/0166470 A1 | 6/2018 | Chae |
| 2020/0035147 A1 | 1/2020 | Ban et al. |
| 2020/0074917 A1 | 3/2020 | Li et al. |

FOREIGN PATENT DOCUMENTS

| | | |
|---|---|---|
| CN | 105527748 A | 4/2016 |
| CN | 109031779 A | 12/2018 |
| CN | 109116626 A | 1/2019 |
| CN | 109375422 A | 2/2019 |
| CN | 109557720 A | 4/2019 |
| CN | 110018593 A | 7/2019 |
| EP | 3346320 A1 | 7/2018 |
| KR | 20120063153 A | 6/2012 |

* cited by examiner

BINDING BACKPLANE AND MANUFACTURING METHOD THEREOF, BACKLIGHT MODULE AND DISPLAY DEVICE

CROSS-REFERENCE TO RELATED APPLICATIONS

The present application is a U.S. National Stage Application under 35 U.S.C. § 371 of International Patent Application No. PCT/CN2019/098189, filed on Jul. 29, 2019, the disclosure of which is incorporated by reference herein in its entirety.

TECHNICAL FIELD

The present disclosure relates to a binding backplane and a manufacturing method thereof, a backlight module, and a display device.

BACKGROUND

Among the flat panel display devices, the liquid crystal display device occupies a dominant position in the product market due to its characteristics such as small volume, low power consumption, relatively low manufacturing cost, and no radiation. The liquid crystal display device generally comprises a liquid crystal panel that does not emit light itself, and a backlight module disposed on a back side of the liquid crystal panel to provide backlight for the liquid crystal panel. How to reduce the thickness of the backlight module, increase the production yield, and reduce the manufacturing cost has always been the main direction of research and development by those skilled in the art.

SUMMARY

According to an aspect of embodiments of the present disclosure, a binding backplane is provided. The binding backplane comprises: a substrate; a first trace layer on a side of the substrate; a planarizing layer on a side of the first trace layer away from the substrate; a second trace layer on a side of the planarizing layer away from the substrate and connected to the first trace layer through a via hole, wherein the second trace layer comprises a connecting portion and a binding portion connected to the connecting portion and configured to bind a light emitting diode; a surface protective layer on a side of the second trace layer away from the substrate and exposing the binding portion; and a conductive reflection structure on a side of the surface protective layer close to the substrate, wherein the conductive reflection structure comprises a grounding portion isolated from the first trace layer and the second trace layer, a distance between a surface of the grounding portion away from the substrate and the substrate being not greater than a distance between a surface of the binding portion away from the substrate and the substrate.

In some embodiments, the binding backplane further comprises an inner protective layer between the second trace layer and the surface protective layer and exposing the binding portion, wherein the conductive reflection structure is a conductive reflection layer between the surface protective layer and the inner protective layer.

In some embodiments, the conductive reflection layer further comprises an isolation portion isolated from the grounding portion; an orthographic projection of the grounding portion on the substrate does not overlap with an orthographic projection of the second trace layer on the substrate; and an orthographic projection of the isolation portion on the substrate at least partially overlaps with an orthographic projection of the connecting portion on the substrate.

In some embodiments, the conductive reflection layer comprises a first transparent conductive layer, a silver layer, and a second transparent conductive layer that are sequentially arranged along a direction away from the substrate.

In some embodiments, the binding backplane further comprises a buffer layer between the substrate and the first trace layer.

In some embodiments, the conductive reflection structure comprises a first conductive reflection layer between the substrate and the first trace layer and isolated from the first trace layer, the first conductive reflection layer being grounded.

In some embodiments, the conductive reflection structure further comprises a second conductive reflection layer on a side of the first trace layer away from the substrate.

In some embodiments, the conductive reflection structure further comprises a third conductive reflection layer on a side of the connecting portion away from the substrate.

In some embodiments, the binding backplane further comprises a buffer layer between the first conductive reflection layer and the first trace layer, wherein the first conductive reflection layer is isolated from the first trace layer by the buffer layer.

In some embodiments, the first conductive reflection layer, the second conductive reflection layer, and the third conductive reflection layer each comprises a first transparent conductive layer, a silver layer, and a second transparent conductive layer that are sequentially arranged along a direction away from the substrate.

In some embodiments, the binding backplane further comprises a trace protective layer between the first trace layer and the planarizing layer.

In some embodiments, the substrate comprises a glass substrate or a resin substrate.

According to another aspect of embodiments of the present disclosure, a manufacturing method for a binding backplane is provided. The manufacturing method comprises: forming a first trace layer on a side of a substrate; forming a planarizing layer on a side of the first trace layer away from the substrate, wherein the planarizing layer has a via hole leading to the first trace layer; forming a second trace layer on a side of the planarizing layer away from the substrate, wherein the second trace layer is connected to the first trace layer through the via hole, and the second trace layer comprises a connecting portion and a binding portion connected to the connecting portion and configured to bind a light emitting diode; forming a conductive reflection structure, wherein the conductive reflection structure comprises a grounding portion isolated from the first trace layer and the second trace layer, a distance between a surface of the grounding portion away from the substrate and the substrate being not greater than a distance between a surface of the binding portion away from the substrate and the substrate; and forming a surface protective layer on a side of the second trace layer away from the substrate, wherein the surface protective layer exposes the binding portion.

In some embodiments, the conductive reflection structure is a conductive reflection layer, and in addition to the grounding portion, the conductive reflection layer further comprises an isolation portion isolated from the grounding portion, the manufacturing method comprising: forming an inner protective layer on a side of the second trace layer away from the substrate; forming the conductive reflection layer on a side of the inner protective layer away from the substrate, wherein an orthographic projection of the grounding portion of the conductive reflection layer on the substrate does not overlap with an orthographic projection of the second trace layer on the substrate, and an orthographic projection of the isolation portion of the conductive reflection layer on the substrate at least partially overlaps with an orthographic projection of the connecting portion on the substrate; and forming the surface protective layer on a side of the conductive reflection layer away from the substrate, and making the surface protective layer and the inner protective layer expose the binding portion.

In some embodiments, the manufacturing method further comprises forming a buffer layer on a side of the substrate before forming the first trace layer.

In some embodiments, the conductive reflection structure comprises a first conductive reflection layer, a second conductive reflection layer and a third conductive reflection layer provided in different layers, the manufacturing method comprising: sequentially forming the first conductive reflection layer for grounding and a buffer layer on a side of the substrate before forming the first trace layer; forming the second conductive reflection layer on a side of the first trace layer away from the substrate in a patterning process of forming the first trace layer; and forming the third conductive reflection layer on a side of the connecting portion away from the substrate after forming the second trace layer and before forming the surface protective layer.

In some embodiments, the manufacturing method further comprises forming a trace protective layer on a side of the first trace layer away from the substrate after forming the first trace layer and before forming the planarizing layer.

According to a further aspect of the embodiments of the present disclosure, a backlight module is provided. The backlight module comprises: the binding backplane according to any one of the foregoing technical solutions, and a plurality of light emitting diodes bound to the binding backplane.

In some embodiments, the plurality of light emitting diodes are sub-millimeter light emitting diodes.

According to still another aspect of embodiments of the present disclosure, a display device is provided. The display device comprises the backlight module according to the foregoing technical solutions.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
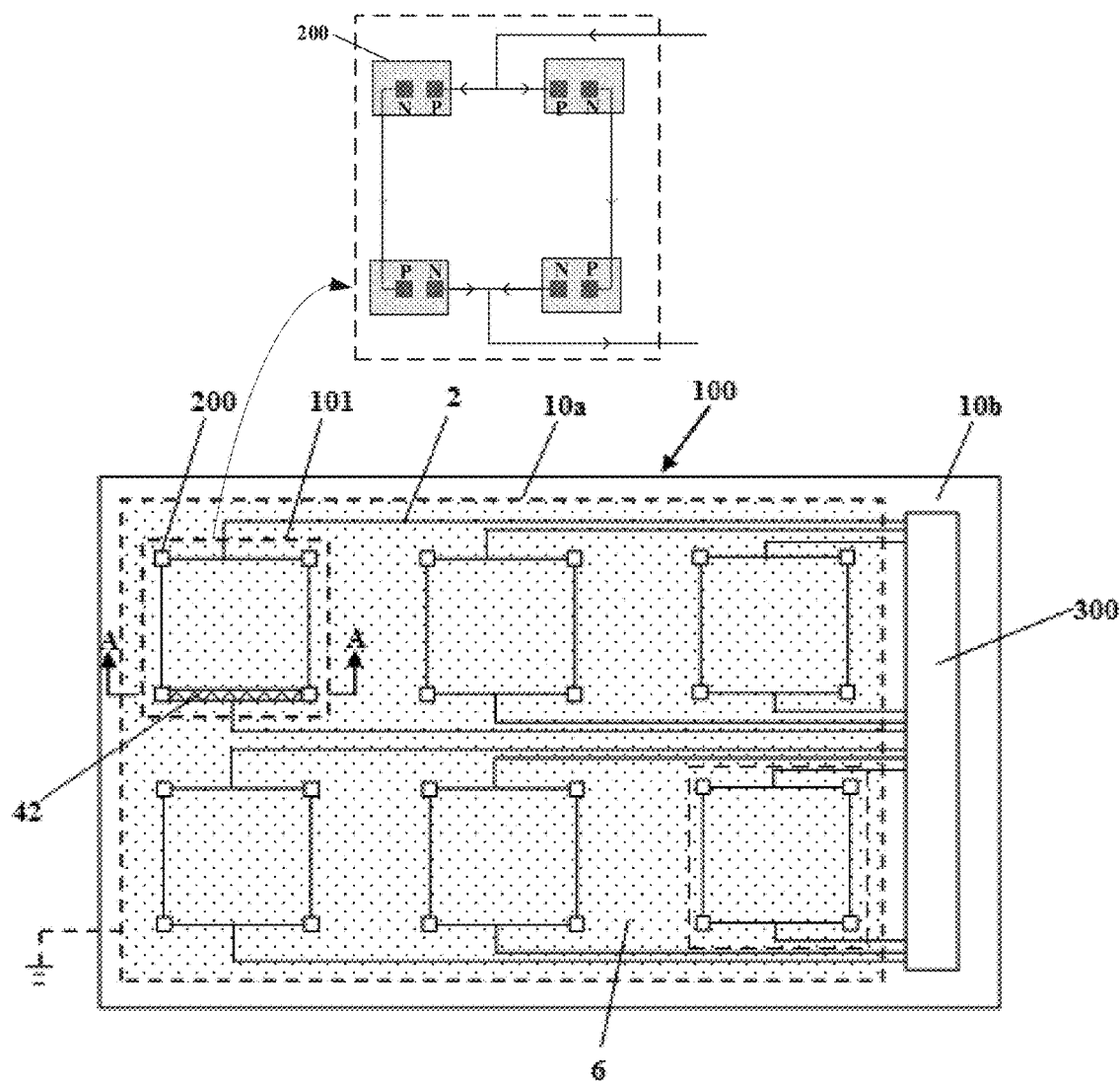
FIG. 1a is a schematic top view after a light emitting diode and an IC are bound to a binding backplane according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In a backlight module in the related art, a PCB (Printed Circuit Board) which is bound with a MiniLED (sub-millimeter light emitting diode, intended to refer to a light emitting diode with a grain size of about 100 microns) and an IC (Integrated Circuit) is used as a core light source component. The backlight module is divided into a plurality of sub-light emitting areas, each of which is provided with a plurality of MiniLEDs. By a circuit design of the PCB, MiniLEDs in different sub-light emitting areas may be controlled to emit light respectively, thereby achieving partition control of the backlight module to emit light. When the liquid crystal display device needs to display black in a partial area of the screen, the MiniLEDs in the sub-light emitting area corresponding to the partial area are turned off, which may not only save the backlight energy consumption, but also improve the contrast of the liquid crystal display device screen and improve the display quality. When the liquid crystal display device performs HDR (High-Dynamic Range) display, the partition control of the backlight module to emit light enables the display to provide a wider brightness range, so that a display effect is better.

However, the backlight module in the related art is limited by the structure and cost of the PCB, and has the defects of large thickness and high manufacturing cost, which is not favorable for further development of the liquid crystal display device in the direction of light weight, thinning and low cost.

In order to solve the above-described technical problems, the embodiments of the present disclosure provide a binding backplane and a manufacturing method thereof, a backlight module and a display device, so as to improve the production yield and reduce the manufacturing cost whilst reducing the thickness of the backlight module.

As shown in FIG. 1a, a binding backplane 100 comprises a first binding area 10a for binding a light emitting diode 200 and a second binding area 10b for binding an IC 300. The first binding area 10a serves as a light emitting area of the binding backplane 100. The light emitting diode 200 and the IC 300 are bound to the binding backplane 100, they together serve as a light source component of the backlight module. By a circuit design on the binding backplane 100, the light source component of the backlight module may be divided into a plurality of sub-light emitting areas 101, each of which may be independently controlled to emit light. The light emitting diode 200 may be MiniLED or MicroLED (micro light emitting diode).

Figure 1B:
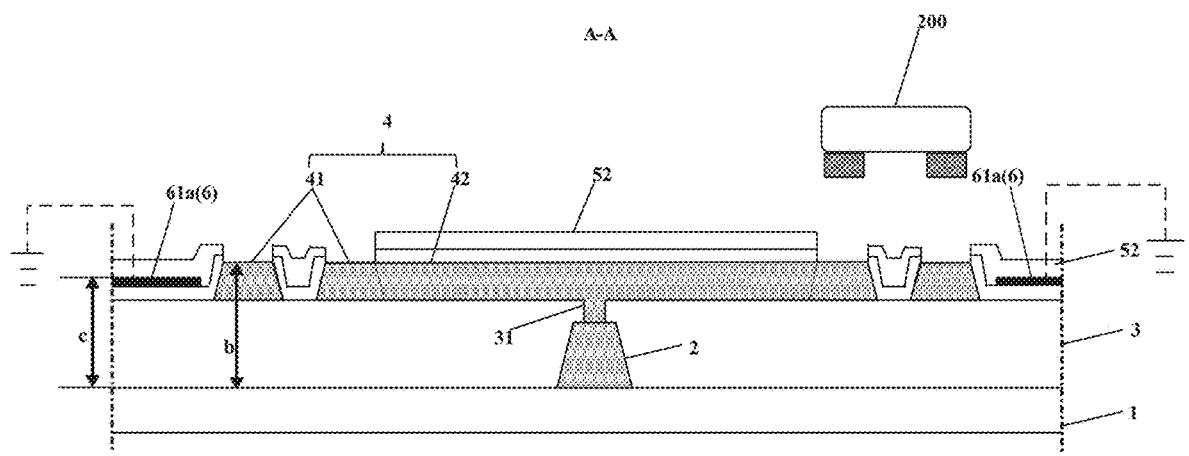
FIG. 1b is a schematic cross-sectional view of a bonded backplane at A-A of FIG. 1a according to an embodiment of the present disclosure.

As shown in FIGS. 1a and 1b, the binding backplane 100 according to an embodiment of the present disclosure comprises: a substrate 1; a first trace layer 2 on a side of the substrate 1; a planarizing layer 3 on a side of the first trace layer 2 away from the substrate 1; and a second trace layer 4 on a side of the planarizing layer 3 away from the substrate 1 and connected to the first trace layer 2 through a via hole 31. The second trace layer 4 comprises a connecting portion 42 and a binding portion 41 connected to the connecting portion 42 and configured to bind the light emitting diode 200. The binding backplane 100 further comprises a surface protective layer 52 on a side of the second trace layer 4 away from the substrate 1 and exposing the binding portion 41.

The binding backplane 100 further comprises a conductive reflection structure 6 on a side of the surface protective layer 52 close to the substrate 1. The conductive reflection structure 6 comprises a grounding portion 61a isolated from the first trace layer 2 and the second trace layer 4. A distance c between a surface of the grounding portion 61a away from the substrate 1 and the substrate 1 is not greater than a distance b between a surface of the binding portion 41 away from the substrate 1 and the substrate 1.

The first trace layer 2 is connected to the second trace layer 4 in the first binding area 10a and is connected to the IC 300 in the second binding area 10b. Therefore, a signal of the IC 300 may be transmitted to the light emitting diode 200 through the first trace layer 2 and the second trace layer 4, so as to achieve partition control to emit light. In each embodiment of the present disclosure, "connected" refers to an electrical connection.

The binding portion 41 of the second trace layer 4 is a pair of spaced-apart binding electrodes, which are configured to bind two electrodes of the light emitting diode 200. By a circuit design of the first trace layer 2 and the second trace layer 4, the partition control of the light emitting diodes 200 in different sub-light-emitting areas 101 may be achieved. In the embodiment shown in FIG. 1a, each sub-light emitting area 101 comprises four light emitting diodes 200, two of which are connected in series and then connected in parallel. Specifically, a current flowing into the sub-light emitting area 101 is divided into two shunts, and the two shunts pass through the two light emitting diodes 200 connected in series and then converge into one flowing out of the sub-light emitting area 101 (the current direction is as shown by an arrow direction in a partially enlarged view of the figure), where P represents a binding electrode for binding a positive electrode of the light emitting diode 200, and N represents a binding electrode for binding a negative electrode of the light emitting diode 200. FIG. 1a shows only one of the examples of the circuit structure of the present disclosure. It may be understood that other different circuit structures that can achieve partition control may be designed as necessary.

In the embodiments of the present disclosure, the substrate 1 may be a glass substrate or a resin substrate, with a thickness that may be made thinner, thereby facilitating reducing the thickness of the backlight module and saving the manufacturing cost. The planarizing layer 3 is configured to improve a level difference formed by the first trace layer 2 having a certain thickness, so as to provide a relatively flat production base for the second trace layer 4. The surface protective layer 52 which is in contact with an ambient environment as a surface layer of the binding backplane, may mechanically protect an internal trace, and prevent the trace from being scratched, and may prevent water and oxygen from entering. When the light emitting diode 200 is bound to the binding backplane, the two electrodes of the light emitting diode 200 are bound and connected to the binding portion 41 exposed by the surface protective layer 52.

In the foregoing embodiment, in order to improve the utilization rate of the light source, the binding backplane is also provided with the conductive reflection structure 6 to reflect the light emitted by the light emitting diode 200 toward the side away from the substrate. Since the first binding area 10a serves as a light emitting area of the binding backplane, the conductive reflection structure 6 needs to be provided at least in the first binding area 10a of the binding backplane. On the premise that the conductive reflection structure 6 does not shield the binding portion 41, the larger an effective reflection area of the first binding area 10a is, the better it will be. The conductive reflection structure 6 generally comprises the grounding portion 61a connected to a ground wire, wherein the grounding portion 61a is in the ground circuit of the backlight module and isolated from the first trace layer 2 and the second trace layer 4 of the binding backplane.

Figure 2A:
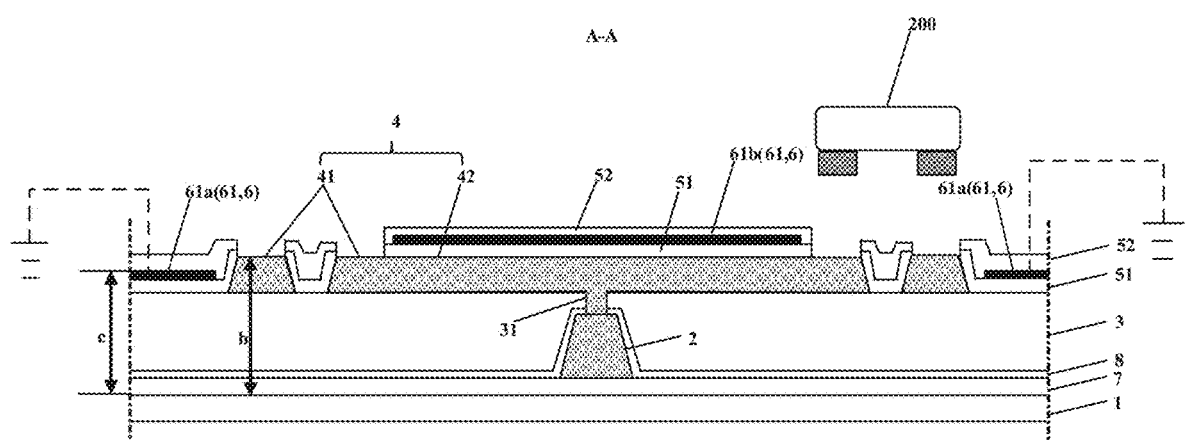
FIG. 2a is a schematic cross-sectional view of a binding backplane at A-A of FIG. 1a according to another embodiment of the present disclosure.

As shown in FIG. 2a, in another embodiment of the present disclosure, the binding backplane further comprises an inner protective layer 51 between the second trace layer 4 and the surface protective layer 52 and exposing the binding portion 41. The conductive reflection structure 6 is specifically a conductive reflection layer 61 between the surface protective layer 52 and the inner protective layer 51. An orthographic projection of the grounding portion 61a of the conductive reflection layer 61 on the substrate 1 does not overlap with an orthographic projection of the second trace layer 4 on the substrate 1, and the distance c between the surface of the grounding portion 61a away from the substrate 1 and the substrate 1 is not greater than the distance b between the surface of the binding portion 41 away from the substrate 1 and the substrate 1.

In order to increase the effective reflection area of the conductive reflection structure 6 as much as possible and improve the utilization rate of the light source, the conductive reflection structure 6 further comprises an isolation portion 61b isolated from the grounding portion 61a. The isolation portion 61b mainly serves to reflect light, and an orthographic projection of the isolation portion 61b on the substrate 1 does not overlap with the orthographic projection of the grounding portion 61a on the substrate 1. As shown in FIG. 2a, in the embodiment, the isolation portion 61b is on a side of the connecting portion 42 away from the substrate 1, and the orthographic projection of the isolation portion 61b on the substrate 1 partially overlaps or coincides with an orthographic projection of the connecting portion 42 on the substrate 1, so that the area where the connecting portion 42 is located may also reflect light.

In an embodiment, when the first binding area of the binding backplane is viewed from the side of the surface protective layer 52, the exposed binding portion 41 is visible, and the first trace layer 2 and the connecting portion 42 which are shielded by the conductive reflection layer 61 is substantially invisible.

Figure 2B:
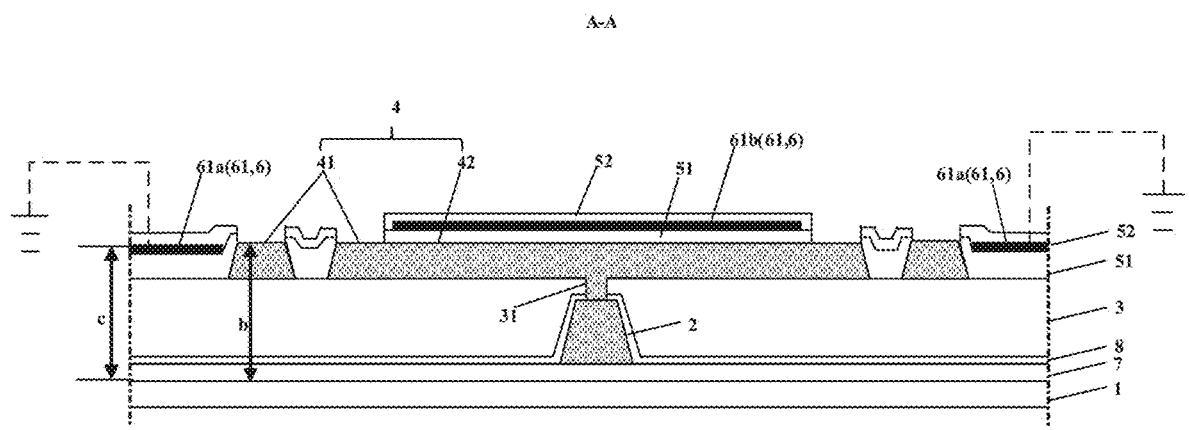
FIG. 2b is a schematic cross-sectional view of a binding backplane at A-A of FIG. 1a according to another embodiment of the present disclosure.

In actual design, the surface of the grounding portion 61a of the conductive reflection layer 61 away from the substrate 1 may be lower than the surface of the binding portion 41 away from the substrate 1 (as shown in FIG. 2a), or may be flush with the surface of the binding portion 41 away from the substrate 1 (as shown in FIG. 2b). Specifically, it may be implemented by designing a thickness of the inner protective layer 51.

As shown in FIG. 2a, in the embodiment, the binding backplane further comprises a buffer layer 7 between the substrate 1 and the first trace layer 2. That is, the buffer layer 7 is formed on a side of the substrate 1, and the first trace layer 2 is formed on a side of the buffer layer 7 away from the substrate 1. The buffer layer 7 may reduce the stress caused by the difference in materials on both sides, thereby improving the mechanical strength of the binding backplane.

In addition, the binding backplane further comprises a trace protective layer 8 between the first trace layer 2 and the planarizing layer 3. The trace protective layer 8 may protect the first trace layer 2 to prevent damage to the first trace layer 2 caused by a subsequent process.

As may be seen from FIG. 2a, the grounding portion 61a of the conductive reflection layer 61 and the first trace layer 2 are spaced apart by the planarizing layer 3, the trace protective layer 8 and the inner protective layer 51, so that the grounding portion 61a is insulated from the first trace layer 2. The grounding portion 61a of the conductive reflection layer 61 and the second trace layer 4 are spaced apart by the inner protective layer 51, so that the grounding portion 61a is insulated from the second trace layer 4.

Figure 3:
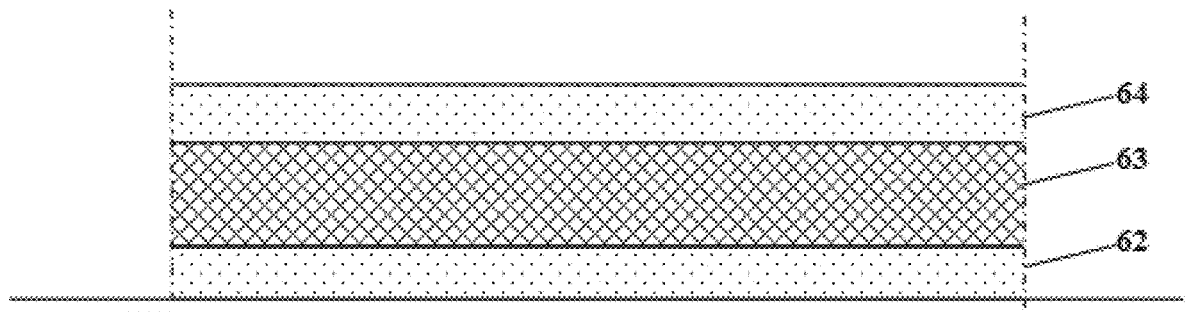
FIG. 3 is an enlarged schematic cross-sectional view of a conductive reflection layer according to an embodiment of the present disclosure.

In some embodiments, as shown in FIG. 3, the conductive reflection layer comprises a first transparent conductive layer 62, a silver layer 63, and a second transparent conductive layer 64 that are sequentially arranged along a direction away from the substrate. A thickness of the conductive reflection layer 61 is 500-3000 angstroms. The silver layer 63 is excellent in reflectivity but likely to be oxidized, and the first transparent conductive layer 62 and the second transparent conductive layer 64 may play a protective effect on the silver layer 63 against oxidation. The first transparent conductive layer 62 and the second transparent conductive layer 64 may be made of materials such as indium tin oxide or zinc oxide.

Figure 5:
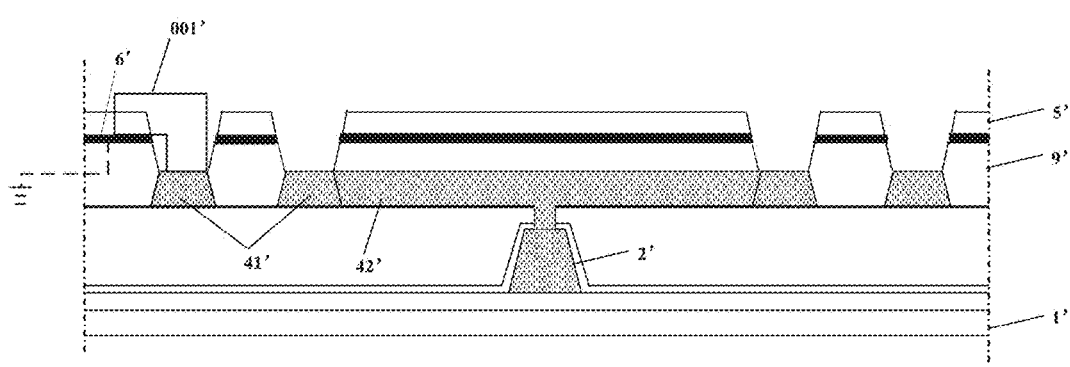
FIG. 5 is a schematic cross-sectional view of a binding backplane at A-A of FIG. 1a according to a comparative example of the present disclosure.

One comparative example of the present disclosure is shown in FIG. 5. In this comparative example, the conductive reflection structure of the binding backplane is a conductive reflection layer 6' which is integrally grounded, wherein the conductive reflection layer 6' is on a side of a connecting portion 42' and a binding portion 41' away from a substrate 1', and spaced apart from the layer where the connecting portion 42' and the binding portion 41' are located by an insulating layer 9'. Before the light emitting diode is bound to the binding backplane, it is necessary to first print the solder tin on the binding portion 41' by applying a certain force in a screen printing manner, which often causes the solder tin 001' to penetrate a surface protective layer 5 and be connected to the conductive reflection layer 6', so that the bound light emitting diode is short-circuited with the conductive reflection layer 6', and the electrode of the light emitting diode is grounded. As a result, the light emitting diode is changed from a constant current drive required by the design to a constant voltage drive, thereby resulting in abnormal brightness. If it is applied to a display device, the display effect of the display device will be seriously affected.

After a number of experiments, the inventors of the present application have found that the reason why short-circuit is likely to occur in the comparative example lies in that the conductive reflection layer 6' and the layer where the binding portion 41' is located are spaced apart by the insulating layer 9' with a certain thickness. That is, a certain positive level difference is formed. This results in that during the screen printing, the solder tin 001' easily penetrates the surface protective layer 5' and is connected to the conductive reflection layer 6' under the printing force. In this way, the light emitting diode is short-circuited with the conductive reflection layer 6' after being bound to the binding portion 41'.

In the foregoing embodiment of the present disclosure, the level difference between the grounding portion 61a of the conductive reflection layer 61 and the binding portion 41 is designed to be zero or negative, so that during the screen printing, the force applied to the binding portion 41 is greater than the force applied to the grounding portion 61a, thereby effectively preventing the solder tin from contacting the grounding portion 61a and solving the short-circuit problem in the comparative example.

Figure 4:
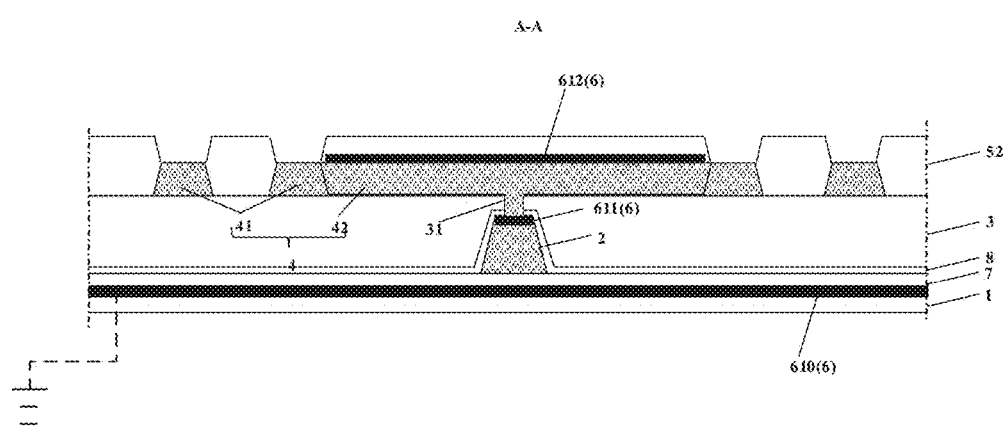
FIG. 4 is a schematic cross-sectional view of a binding backplane at A-A of FIG. 1a according to a further embodiment of the present disclosure.

As shown in FIG. 4, in another embodiment of the present disclosure, the conductive reflection structure 6 comprises a first conductive reflection layer 610 between the substrate 1 and the first trace layer 2 and isolated from the first trace layer 2. The first conductive reflection layer 610 is grounded, that is, serving as the grounding portion of the conductive reflection structure 6.

The first conductive reflection layer 610 covers at least the first binding area of the substrate 1. To simplify the manufacturing process, the first conductive reflection layer 610 may also cover the entire substrate 1.

Since the first trace layer 2 and the second trace layer 4 are on a side of the first conductive reflection layer 610 away from the substrate 1, in order to increase the effective reflection area of the conductive reflection structure 6, in some embodiments of the present disclosure, the conductive reflection structure 6 may further comprise a second conductive reflection layer 611 on the side of the first trace layer 2 away from the substrate 1 and a third conductive reflection layer 612 on a side of the connecting portion 42 away from the substrate 1.

Viewing the first binding area of the binding backplane in the present embodiment from the side of the surface protective layer 52, the exposed binding portion 41 is visible, and the first trace layer 2 which is shielded by the second conductive reflection layer 611 is substantially invisible, and the connecting portion 42 which is shielded by the third conductive reflection layer 612 is substantially invisible. The effective reflection area of the conductive reflection structure 6 is maximized.

In the embodiment, a buffer layer 7 is provided between the first conductive reflection layer 610 and the first trace layer 2. The first conductive reflection layer 610 is isolated from the first trace layer 2 by the buffer layer 7. Specifically, the first conductive reflection layer 610 provided to be grounded is formed on a side of the substrate 1, the buffer layer 7 is formed on the side of the first conductive reflection layer 610 away from the substrate 1, and the first trace layer 2 is formed on the side of the buffer layer 7 away from the substrate 1.

For materials and structures of the first conductive reflection layer 610, the second conductive reflection layer 611, and the third conductive reflection layer 612, reference may be made to the conductive reflection layer 61 of the foregoing embodiment. For example, in some embodiments, the first conductive reflection layer 610, the second conductive reflection layer 611, and the third conductive reflection layer 612 each comprises a first transparent conductive layer, a silver layer, and a second transparent conductive layer that are sequentially arranged along a direction away from the substrate. Thicknesses of the first conductive reflection layer 610, the second conductive reflection layer 611 and the third conductive reflection layer 612 are respectively 500-3000 angstroms. In some embodiments of the present disclosure, a thickness of the first transparent conductive layer is 200-400 angstroms.

Still taking the embodiment shown in FIG. 5 as a comparative example, in this embodiment of the present disclosure, the first conductive reflection layer 610 of the conductive reflection structure 6 that is provided to be grounded is between the substrate 1 and the first trace layer 2, and the first conductive reflection layer 610 are spaced apart from the binding portion 41 by at least the buffer layer 7, the first trace layer 2 and the planarizing layer 3, the level difference between the first conductive reflection layer 610 and the binding portion 41 is negative and an absolute value of the level difference is large. When the solder tin is printed on the binding portion 41 in a screen printing manner, the printing force cannot allow the solder tin to make the binding portion 41 be short-circuited with the first conductive reflection layer 610, thereby solving the short-circuit problem in the comparative example.

In some embodiments of the present disclosure, a manufacturing method for a binding backplane is also provided. The manufacturing method comprises the following steps: forming a first trace layer on a side of a substrate; forming a planarizing layer on a side of the first trace layer away from the substrate, wherein the planarizing layer has a via hole leading to the first trace layer; forming a second trace layer on a side of the planarizing layer away from the substrate, wherein the second trace layer is connected to the first trace layer through the via hole, and the second trace layer comprises a connecting portion and a binding portion connected to the connecting portion and configured to bind a light emitting diode; forming a surface protective layer on a side of the second trace layer away from the substrate, wherein the surface protective layer exposes the binding portion. In addition, the manufacturing method further comprises forming a conductive reflection structure before forming the surface protective layer. The conductive reflection structure comprises a grounding portion isolated from the first trace layer and the second trace layer. A distance between a surface of the grounding portion away from the substrate and the substrate is not greater than a distance between a surface of the binding portion away from the substrate and the substrate.

The manufacturing method for the binding backplane provided by the embodiments of the present disclosure may not only reduce the thickness of the binding backplane, but also solve the short-circuit problem in the aforementioned comparative example, improve the product yield and reduce the manufacturing cost.

In some embodiments, the conductive reflection structure is a conductive reflection layer. In addition to the grounding portion, the conductive reflection layer further comprises an isolation portion isolated from the grounding portion. The process of forming the binding backplane comprises: forming an inner protective layer on a side of the second trace layer away from the substrate; forming the conductive reflection layer on a side of the inner protective layer away from the substrate, wherein an orthographic projection of the grounding portion of the conductive reflection layer on the substrate does not overlap with an orthographic projection of the second trace layer on the substrate, and an orthographic projection of the isolation portion of the conductive reflection layer on the substrate at least partially overlaps with an orthographic projection of the connecting portion on the substrate; and forming the surface protective layer on a side of the conductive reflection layer away from the substrate, and making the surface protective layer and the inner protective layer expose the binding portion.

Figure 6:
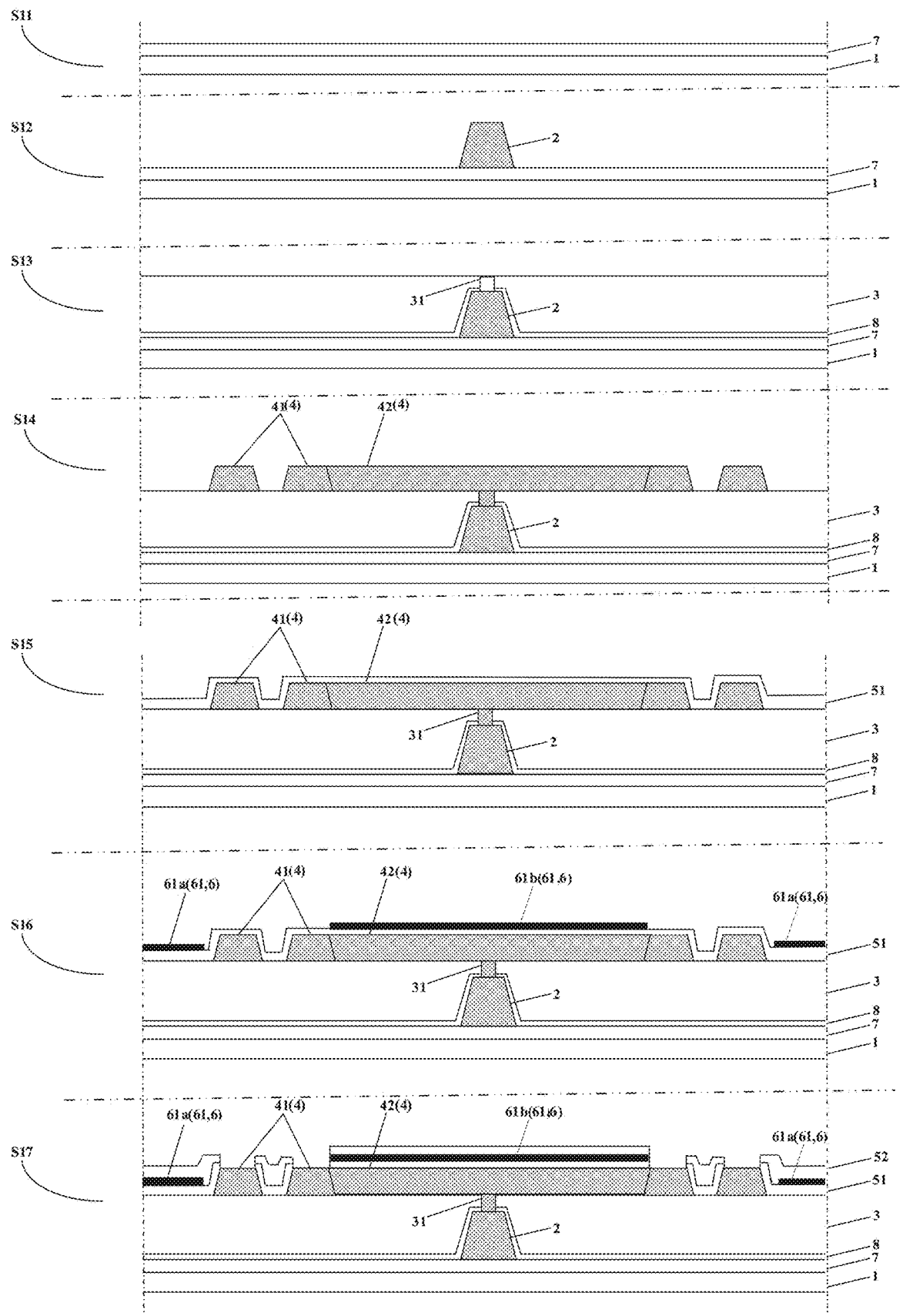
FIG. 6 is a schematic view of manufacturing steps of a manufacturing method for a binding backplane according to an embodiment of the present disclosure.

As shown in FIG. 6, the process of manufacturing the binding backplane shown in FIG. 2a comprises the following steps S11-S17.

Step S11: a buffer layer 7 is formed on a side of the substrate 1.

The buffer layer 7 may be a single-layer structure, for example a silicon nitride layer or a silicon dioxide layer, or a composite layer structure, comprising the silicon nitride layer and the silicon dioxide layer. A thickness of the buffer layer 7 is 500 angstroms to 5000 angstroms.

Step S12: a first trace layer 2 is formed on a side of the buffer layer 7 away from the substrate 1 by a patterning process.

A thickness of the first trace layer 2 is 1.5 microns to 2.5 micron. The first trace layer 2 comprises a molybdenum-niobium alloy layer, a copper layer, and a molybdenum-niobium alloy layer that are sequentially arranged along a direction away from the substrate 1.

Step S13: a trace protective layer 8 and a planarizing layer 3 are formed on a side of the first trace layer 2 away from the substrate 1 by a patterning process.

The trace protective layer 8 and the planarizing layer 3 are sequentially arranged along the direction away from the substrate 1, and a via hole 31 leading to the first trace layer 2 is formed after the forming of the trace protective layer 8 and the planarizing layer 3 is completed. A material of the trace protective layer 8 may be silicon nitride, and a thickness of the trace protective layer 8 is 500 angstroms to 1000 angstroms. A material of the planarizing layer 3 may be resin, and a maximum thickness of the planarizing layer 3 is 1.5 microns to 2.5 microns.

Step S14: a second trace layer 4 is formed on a side of the planarizing layer 3 away from the substrate 1 by a patterning process.

The second trace layer 4 comprises a connecting portion 42 and a binding portion 41 connected to the connecting portion 42 and configured to bind the light emitting diode. After the second trace layer 4 is formed, the second trace layer 4 is connected to the first trace layer 2 by the via hole 31 formed at Step S13. The second trace layer 4 may be a single-layer structure, for example a copper layer or a molybdenum-niobium alloy layer. The second trace layer 4 may also be a composite layer structure, comprising the copper layer and the molybdenum-niobium alloy layer sequentially arranged along the direction away from the substrate 1. A thickness of the second trace layer 4 is 3000 angstroms to 6000 angstroms.

Step S15: an inner protective layer 51 is formed on a side of the second trace layer 4 away from the substrate 1.

In a subsequent manufacturing process, the inner protective layer 51 may protect the second trace layer 4 so as to reduce the etching damage. A thickness of the inner protective layer 51 is 1500 angstroms to 3000 angstroms. The inner protective layer 51 may be a single-layer structure, for example a silicon nitride layer or a silicon dioxide layer, or a composite layer structure, comprising the silicon nitride layer and the silicon dioxide layer.

Step S16: a conductive reflection layer 61 is formed on a side of the inner protective layer 51 away from the substrate 1 by a patterning process.

The conductive reflection layer 61 comprises a grounding portion and an isolation portion. After the conductive reflection layer 61 is formed, an orthographic projection of its grounding portion on the substrate 1 does not overlap with an orthographic projection of the second trace layer 4 on the substrate 1, and a distance between a surface of the grounding portion away from the substrate 1 and the substrate 1 is not greater than a distance between a surface of the binding portion 41 away from the substrate 1 and the substrate 1. The isolation portion of the conductive reflection layer 61 is located on a side of the connecting portion 42 away from the substrate 1, and an orthographic projection portion of the isolation portion on the substrate 1 partially overlaps or coincides with an orthographic projection portion of the connecting portion 42 on the substrate 1. The conductive reflection layer 61 is a composite layer structure, comprising a first transparent conductive layer, a silver layer and a second transparent conductive layer which are sequentially arranged along the direction away from the substrate 1. A thickness of the conductive reflection layer 61 is 500-3000 angstroms. The first transparent conductive layer and the second transparent conductive layer may be made of materials such as indium tin oxide, zinc oxide, or the like.

Step S17: a surface protective layer 52 is formed on a side of the conductive reflection layer 61 away from the substrate 1, and the surface protective layer 52 and the inner protective layer 51 are made to expose the binding portion 41 of the second trace layer 4 by an etching process.

A thickness of the surface protective layer 52 is 1500 angstroms to 3000 angstroms. The surface protective layer 52 may be a single-layer structure, for example a silicon nitride layer or a silicon dioxide layer, or a composite layer structure, comprising the silicon nitride layer and the silicon dioxide layer.

In other embodiments, the process of forming the binding backplane comprises: sequentially forming a first conductive reflection layer for grounding and a buffer layer on a side of the substrate before forming the first trace layer, wherein the first conductive reflection layer serves as the grounding portion of the conductive reflection structure; forming a second conductive reflection layer on a side of the first trace layer away from the substrate in a patterning process of forming the first trace layer, wherein the second conductive reflection layer serves as the isolation portion of the conductive reflection structure; and forming a third conductive reflection layer on a side of the connecting portion away from the substrate after forming the second trace layer and before forming the surface protective layer, wherein the third conductive reflection layer serves as the isolation portion of the conductive reflection structure.

Figure 7:
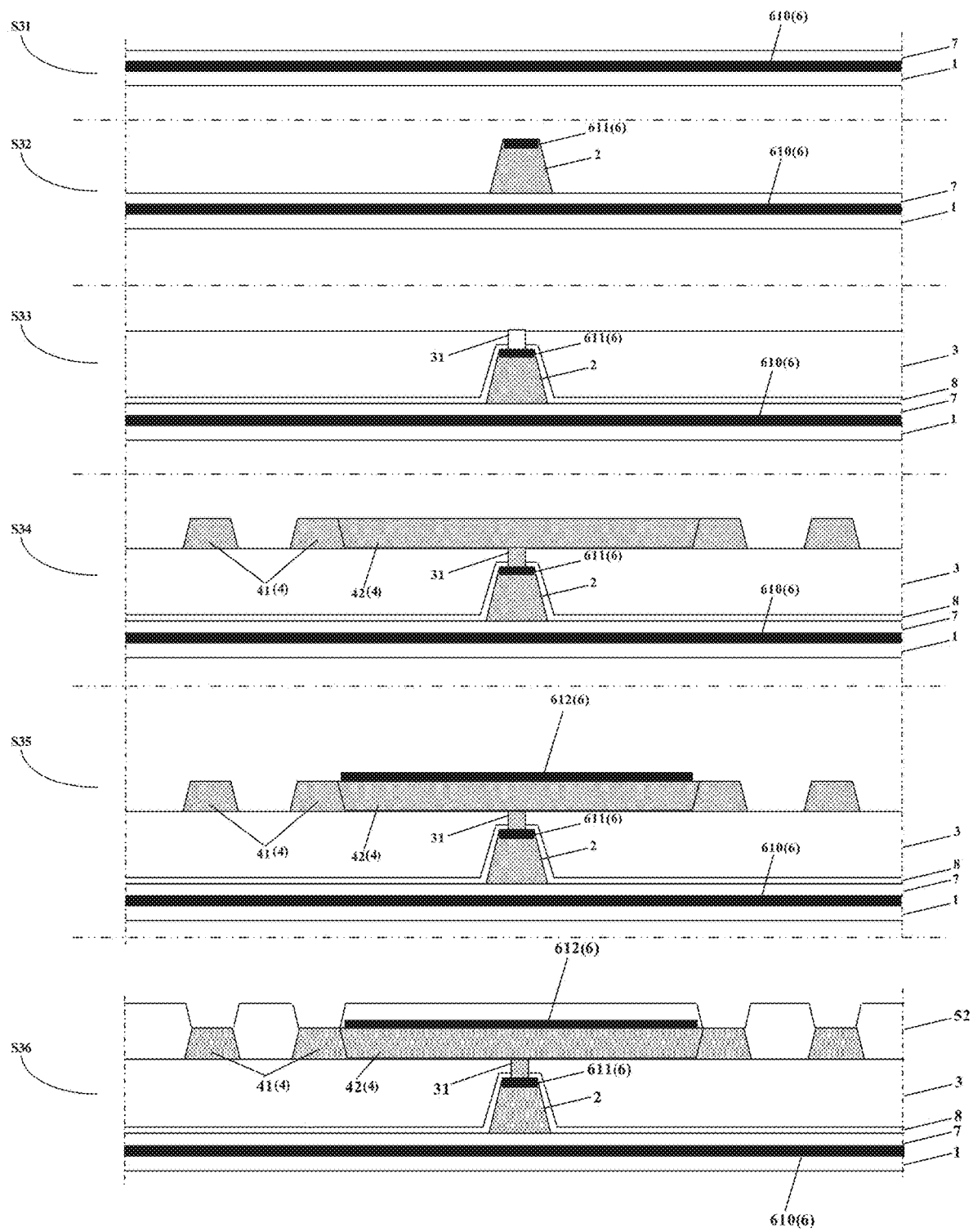
FIG. 7 is a schematic view of manufacturing steps of a manufacturing method for a binding backplane according to another embodiment of the present disclosure.

As shown in FIG. 7, the process of forming the binding backplane shown in FIG. 3 comprises the following steps S31-S36.

Step S31: a first conductive reflection layer 610 and a buffer layer 7 are sequentially formed on a side of the substrate 1.

The first conductive reflection layer 610 is a composite layer structure, comprising a first transparent conductive layer, a silver layer, and a second transparent conductive layer that are sequentially arranged along the direction away from the substrate 1. The thickness of the first conductive reflection layer 610 is 500-3000 angstroms. The first transparent conductive layer and the second transparent conductive layer may be made of materials such as indium tin oxide, zinc oxide, or the like. The buffer layer 7 may be a single-layer structure, for example a silicon nitride layer or a silicon dioxide layer, or a composite layer structure, comprising the silicon nitride layer and the silicon dioxide layer. The thickness of the buffer layer 7 is 500 angstroms to 5000 angstroms. After the first conductive reflection layer 610 is formed, the first conductive reflection layer 610 serves as a grounding portion of the conductive reflection structure.

Step S32: Through a patterning process, a first trace layer 2 is formed on a side of the buffer layer 7 away from the substrate 1, and a second conductive reflection layer 611 is formed on a side of the first trace layer 2 away from the substrate 1. That is, the first trace layer 2 and the second conductive reflection layer 611 are formed in the same patterning process. After the second conductive reflection layer 611 is formed, the second conductive reflection layer 611 serves as an isolation portion of the conductive reflection structure.

A thickness of the first trace layer 2 is 1.5 microns to 2.5 microns. The first trace layer 2 comprises a molybdenum-niobium alloy layer, a copper layer, and a molybdenum-niobium alloy layer that are sequentially arranged along the direction away from the substrate 1. A structure, material and thickness range of the second conductive reflection layer 611 may refer to the first conductive reflection layer 610.

Step S33: a trace protective layer 8 and a planarizing layer 3 are formed on a side of the second conductive reflection layer 611 away from the substrate 1 by a patterning process.

The trace protective layer 8 and the planarizing layer 3 are sequentially arranged along the direction away from the substrate 1, and may be formed in the same patterning process. After the trace protective layer 8 and the planarizing layer 3 are formed, a via hole leading to the second conductive reflection layer 611 is formed. A material of the trace protective layer 8 may be silicon nitride, and a thickness of the trace protective layer 8 is 500 angstroms to 1000 angstroms. A material of the planarizing layer 3 may be resin, and a maximum thickness of the planarizing layer 3 is 1.5 microns to 2.5 microns.

Step S34: a second trace layer 4 is formed on a side of the planarizing layer 3 away from the substrate 1 by a patterning process.

The second trace layer 4 comprises a connecting portion 42 and a binding portion 41 connected to the connecting portion 42 and configured to bind the light emitting diode. After the second trace layer 4 is formed, the second trace layer 4 is connected to the first trace layer 2 through the via hole formed in Step S33. The second trace layer 4 may be a single-layer structure, for example a copper layer or a molybdenum-niobium alloy layer. Or, the second trace layer 4 may also be a composite layer structure, comprising the copper layer and the molybdenum-niobium alloy layer that are arranged sequentially along the direction away from the substrate 1. A thickness of the second trace layer 4 is 3000 angstroms to 6000 angstroms.

Step S35: a third conductive reflection layer 612 is formed on a side of the connecting portion 42 of the second trace layer 4 away from the substrate 1 by a patterning process. After the third conductive reflection layer 612 is formed, the third conductive reflection layer 612 serves as an isolation portion of the conductive reflection structure. A structure, material and thickness range of the third conductive reflection layer 612 may refer to the first conductive reflection layer 610.

Step S36: a surface protective layer 52 is formed on a side of the third conductive reflection layer 612 away from the substrate 1 by a patterning process, wherein the surface protective layer 52 exposes the binding portion 41.

A thickness of the surface protective layer 52 is 1500 angstroms to 3000 angstroms. The surface protective layer 52 may be a single-layer structure, for example a silicon nitride layer or a silicon dioxide layer, or a composite layer structure, comprising the silicon nitride layer and the silicon dioxide layer.

In the embodiment, the first conductive reflection layer 610 may be formed without using a mask, the first trace layer 2 and the second conductive reflection layer 611 may be formed using the same mask, and the trace protective layer 8 and the planarizing layer 3 may be formed using the same mask. Therefore, the manufacturing method for the binding backplane in the embodiment of the present disclosure may save the number of masks used, simplify the process, and reduce the manufacturing cost.

In an embodiment of the present disclosure, a backlight module is further provided. A light source component of the backlight module comprises: the binding backplane according to any one of the foregoing embodiments, and a plurality of light emitting diodes bound to the binding backplane. The light source component is divided into a plurality of sub-light emitting areas, each of which is provided with a plurality of light emitting diodes. By a circuit design of the first trace layer and the second trace layer, the light emitting diodes in different sub-light emitting areas may be controlled to emit light respectively, so as to achieve partition control of the backlight module to emit light. The light emitting diode may be a sub-millimeter light emitting diode or a micro light emitting diode.

As above, compared with the related art, the backlight module of this embodiment has the advantages of thinner thickness, higher production yield and lower manufacturing cost.

In an embodiment of the present disclosure, a display device is also provided. The display device comprises the backlight module of the foregoing embodiments. The display device is a liquid crystal display device, and is not limited to a specific product type. For example, the display device may be a display, a tablet computer, a television, electronic paper, a display screen, or the like.

Since the comprised backlight module has the foregoing advantageous effects, the display device is lighter and thinner, and a manufacturing cost of the display device is lower.

Hereto, various embodiments of the present disclosure have been described in detail. Some details well known in the art are not described to avoid obscuring the concept of the present disclosure. According to the above-described description, those skilled in the art would fully know how to implement the technical solutions disclosed herein.

Although some specific embodiments of the present disclosure have been described in detail by way of examples, those skilled in the art should understand that the above-described examples are only for the purpose of illustration and are not intended to limit the scope of the present disclosure. It should be understood by those skilled in the art that modifications to the above-described embodiments or equivalently substitution of part of the technical features may be made without departing from the scope and spirit of the present disclosure. The scope of the present disclosure is defined by the appended claims.

What is claimed is:

1. A binding backplane, comprising:
   a substrate;
   a first trace layer on a side of the substrate;
   a planarizing layer on a side of the first trace layer away from the substrate;
   a second trace layer on a side of the planarizing layer away from the substrate and connected to the first trace layer through a via hole, wherein the second trace layer comprises a connecting portion and a binding portion connected to the connecting portion and configured to bind a light emitting diode;
   a surface protective layer on a side of the second trace layer away from the substrate and exposing the binding portion; and
   a conductive reflection structure on a side of the surface protective layer close to the substrate, wherein the conductive reflection structure comprises a grounding portion isolated from the first trace layer and the second trace layer, a distance between a surface of the grounding portion away from the substrate and the substrate being not greater than a distance between a surface of the binding portion away from the substrate and the substrate.

2. The binding backplane according to claim 1, further comprising an inner protective layer between the second trace layer and the surface protective layer and exposing the binding portion, wherein the conductive reflection structure is a conductive reflection layer between the surface protective layer and the inner protective layer.

3. The binding backplane according to claim 2, wherein:
the conductive reflection layer further comprises an isolation portion isolated from the grounding portion;
an orthographic projection of the grounding portion on the substrate does not overlap with an orthographic projection of the second trace layer on the substrate; and
an orthographic projection of the isolation portion on the substrate at least partially overlaps with an orthographic projection of the connecting portion on the substrate.

4. The binding backplane according to claim 2, wherein the conductive reflection layer comprises a first transparent conductive layer, a silver layer, and a second transparent conductive layer that are sequentially arranged along a direction away from the substrate.

5. The binding backplane according to claim 2, further comprising a buffer layer between the substrate and the first trace layer.

6. The binding backplane according to claim 1, wherein the conductive reflection structure comprises a first conductive reflection layer between the substrate and the first trace layer and isolated from the first trace layer, the first conductive reflection layer being grounded.

7. The binding backplane according to claim 6, wherein the conductive reflection structure further comprises a second conductive reflection layer on the side of the first trace layer away from the substrate.

8. The binding backplane according to claim 7, wherein the conductive reflection structure further comprises a third conductive reflection layer a side of the connecting portion away from the substrate.

9. The binding backplane according to claim 8, wherein the first conductive reflection layer, the second conductive reflection layer, and the third conductive reflection layer each comprises a first transparent conductive layer, a silver layer, and a second transparent conductive layer that are sequentially arranged along a direction away from the substrate.

10. The binding backplane according to claim 6, further comprising a buffer layer between the first conductive reflection layer and the first trace layer, wherein the first conductive reflection layer is isolated from the first trace layer by the buffer layer.

11. The binding backplane according to claim 1, further comprising a trace protective layer between the first trace layer and the planarizing layer.

12. The binding backplane according to claim 11, wherein the substrate comprises a glass substrate or a resin substrate.

13. A backlight module, comprising:
the binding backplane according to claim 1, and
a plurality of light emitting diodes bound to the binding backplane.

14. The backlight module according to claim 13, wherein the plurality of light emitting diodes are sub-millimeter light emitting diodes.

15. A display device, comprising the backlight module according to claim 13.

16. A manufacturing method for a binding backplane, comprising:
forming a first trace layer on a side of a substrate;
forming a planarizing layer on a side of the first trace layer away from the substrate, wherein the planarizing layer has a via hole leading to the first trace layer;
forming a second trace layer on a side of the planarizing layer away from the substrate, wherein the second trace layer is connected to the first trace layer through the via hole, and the second trace layer comprises a connecting portion and a binding portion connected to the connecting portion and configured to bind a light emitting diode;
forming a conductive reflection structure, wherein the conductive reflection structure comprises a grounding portion isolated from the first trace layer and the second trace layer, a distance between a surface of the grounding portion away from the substrate and the substrate being not greater than a distance between a surface of the binding portion away from the substrate and the substrate; and
forming a surface protective layer on a side of the second trace layer away from the substrate, wherein the surface protective layer exposes the binding portion.

17. The manufacturing method according to claim 16, wherein the conductive reflection structure is a conductive reflection layer, and in addition to the grounding portion, the conductive reflection layer further comprises an isolation portion isolated from the grounding portion, the manufacturing method comprising:
forming an inner protective layer on a side of the second trace layer away from the substrate;
forming the conductive reflection layer on a side of the inner protective layer away from the substrate, wherein an orthographic projection of the grounding portion of the conductive reflection layer on the substrate does not overlap with an orthographic projection of the second trace layer on the substrate, and an orthographic projection of the isolation portion of the conductive reflection layer on the substrate at least partially overlaps with an orthographic projection of the connecting portion on the substrate; and
forming the surface protective layer on a side of the conductive reflection layer away from the substrate, and making the surface protective layer and the inner protective layer expose the binding portion.

18. The manufacturing method according to claim 17, further comprising forming a buffer layer on a side of the substrate before forming the first trace layer.

19. The manufacturing method according to claim 16, wherein the conductive reflection structure comprises a first conductive reflection layer, a second conductive reflection layer and a third conductive reflection layer provided in different layers, the manufacturing method comprising:
sequentially forming the first conductive reflection layer for grounding and a buffer layer on a side of the substrate before forming the first trace layer;
forming the second conductive reflection layer on a side of the first trace layer away from the substrate in a patterning process of forming the first trace layer; and
forming the third conductive reflection layer on a side of the connecting portion away from the substrate after forming the second trace layer and before forming the surface protective layer.

20. The manufacturing method according to claim 16, further comprising forming a trace protective layer on a side of the first trace layer away from the substrate after forming the first trace layer and before forming the planarizing layer.

* * * * *